(12) United States Patent
Huang et al.

(10) Patent No.: US 6,242,312 B1
(45) Date of Patent: Jun. 5, 2001

(54) ADVANCED TITANIUM SILICIDE PROCESS FOR VERY NARROW POLYSILICON LINES

(75) Inventors: Yuan-Chang Huang, Hsin-Chu; Ding-Dar Hu, Taichung; Hong-Che Hsiue, Chiao-Yi; Chao-Ray Wang, Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/389,892

(22) Filed: Sep. 3, 1999

(51) Int. Cl.[7] .................... H01L 21/336; H01L 21/44
(52) U.S. Cl. .................... 438/305; 438/682; 438/683
(58) Field of Search .................... 438/305, 683, 438/303, 586, 217, 199, 682, 151

(56) References Cited

U.S. PATENT DOCUMENTS

| | | | |
|---|---|---|---|
| 5,401,674 | * 3/1995 | Anjum et al. | 437/190 |
| 5,413,969 | 5/1995 | Huang | 437/200 |
| 5,612,253 | 3/1997 | Farahani et al. | 437/190 |
| 5,700,717 | 12/1997 | Nowak et al. | 437/192 |
| 5,731,239 | 3/1998 | Wong et al. | 438/296 |
| 5,744,395 | 4/1998 | Shue et al. | 438/305 |
| 6,001,738 | * 12/1999 | Lin et al. | 438/683 |
| 6,030,863 | * 2/2000 | Chang et al. | 438/229 |
| 6,054,386 | * 4/2000 | Prabhakar | 438/682 |
| 6,069,061 | * 5/2000 | Lin et al. | 438/517 |
| 6,130,123 | * 10/2000 | Liang et al. | 438/217 |

* cited by examiner

Primary Examiner—John F. Niebling
Assistant Examiner—Walter L. Lindsay, Jr.
(74) Attorney, Agent, or Firm—George O. Saile; Stephen B. Ackerman

(57) ABSTRACT

A process for forming a low resistance, titanium silicide layer, for use as a component of a narrow width, polycide gate structure, has been developed. The process features a combination of ion implantation procedures, performed prior to, and after, titanium deposition. The combination of ion implantation procedures restricts excessive movement of silicon, from a polysilicon gate structure, as well as from a source/drain region, into the forming titanium silicide layer, during subsequent anneal cycles used to form the titanium silicide layer. The ability to limit the amount of silicon, in the titanium silicide layer, allows a low resistance, titanium silicide layer to be used for polycide gate structures, with a width narrower than 0.20 micrometers.

20 Claims, 2 Drawing Sheets

ADVANCED TITANIUM SILICIDE PROCESS FOR VERY NARROW POLYSILICON LINES

BACKGROUND OF THE INVENTION

(1) Field of the Invention

The present invention relates to processes used to fabricate semiconductor devices, and more specifically to a process used to create a low resistance, metal silicide layer, on a polysilicon structure.

(2) Description of Prior Art

The use of polycide, (metal silicide—polysilicon), gate structures, has resulted in a decrease in word line resistance, for sub-micron, metal oxide semiconductor field effect transistors, (MOSFET), devices, when compared to word lines fabricated using only polysilicon. One version of a polycide layer, used for gate structures, has been a titanium silicide polysilicon gate structure. The ability to selectively form titanium silicide, on polysilicon lines: via deposition of a titanium layer;, annealing to convert the portions of the titanium layer, overlying silicon regions, to titanium silicide; and removing the portions of unreacted titanium; have made titanium silicide an attractive refractory silicide, for use in a polycide gate structure. However as micro-miniaturization, or the use of sub-quarter features, proceeds, conventional procedures, used to create titanium silicide, polycide gate structures, do not allow the needed titanium silicide sheet resistance to be obtained. For example, conventional procedures, comprised of titanium deposition, anneal, removal of unreacted titanium, result in the desired sheet resistance, for polycide gate structures, with widths greater than 0.20 micrometers. However when polycide gate structures, with widths less than 0.20 micrometers are used, the resulting titanium silicide sheet resistance does not satisfy the designed, or desired, word line resistance.

This invention will describe a process for fabricating a titanium silicide layer, in which the resistance of the metal silicide layer is reduced as a result of the unique set of processing steps used. A pre-amorphization, ion implantation procedure, is first used, prior to titanium deposition, to prepare the exposed silicon surfaces, such as the exposed polysilicon, of the gate structure, as well as the exposed, heavily doped, source/drain regions, for the titanium deposition, and subsequent anneal. The pre-amorphization step, retards the movement of silicon atoms, into the forming titanium silicide layer, during the anneal cycle, thus allowing a less silicon rich, and lower resistance, titanium silicide layer to be formed. A second procedure, used in combination with the pre-amorphization ion implantation step, is an ion mixing, or an ion implantation procedure, performed after titanium deposition, but prior to the anneal procedure used to form the metal silicide layer. This procedure places the implanted species, in the titanium layer, near the source/drain interface, again retarding the movement of silicon atoms into the titanium silicide layer, during the anneal procedure, but more importantly retarding movement of boron, if a P type, MOSFET device is used, into the titanium silicide layer. Prior art, such as Anjum et al, in U.S. Pat. No. 5,401,674, describes an ion implantation procedure, into titanium, prior to the anneal, but does not describe the combination of the pre-amorphization, ion implantation, pre-titanium, and the post-titanium, ion mixing, ion implantation procedure.

SUMMARY OF THE INVENTION

It is an object of this invention to form a low resistance, titanium silicide layer, for use as a component for narrow, less than 0.20 micrometer width, polycide word lines.

It is another object of this invention to perform a pre-amorphization, ion implantation procedure, prior to titanium deposition.

It is still another object of this invention to perform an ion mixing procedure, via ion implantation into the titanium layer, prior to the anneal procedure, used to form titanium silicide.

In accordance with the present invention, a process is described for forming a low resistance, titanium silicide layer, for a narrow width, polycide gate structure, via a combination of pre-titanium, and post-titanium, ion implantation procedures. After creation of: a narrow width, polysilicon line; a lightly doped source/drain region; insulator spacers on the sides of the narrow width, polysilicon line; and a heavily doped source/drain region; a pre-amorphization, ion implantation procedure is performed, to exposed polysilicon and silicon regions, using germanium or arsenic ions. After deposition of a titanium, or titanium nitride layer, an ion mixing, ion implantation procedure is used to place germanium or silicon ions, in the titanium, or titanium nitride—titanium layer, near the metal—silicon interface. A first anneal procedure, converts titanium, overlying silicon or polysilicon, to a first phase titanium silicide layer, while titanium overlying insulator layers, remain unreacted. After selective removal of the unreacted titanium, a second anneal is used to convert the first titanium silicide phase, to a more conductive second titanium silicide phase, resulting in a narrow width, polycide gate structure, featuring low word line resistance as a result of forming the low resistance, titanium silicide layer, using the combination of ion implantation procedures, described above.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The method of forming a low resistance, titanium silicide layer, via use of a pre-titanium, pre-amorphization, ion implantation procedure, and via use of a post-titanium, pre-anneal, ion mixing, ion implantation procedure, will now be described in detail. This invention will show the method of forming a low resistance titanium silicide layer, applied to narrow width, polycide gate structures, however this invention can also be applied to any dimension, gate structures, or to other elements of a semiconductor device.

Figure 1:
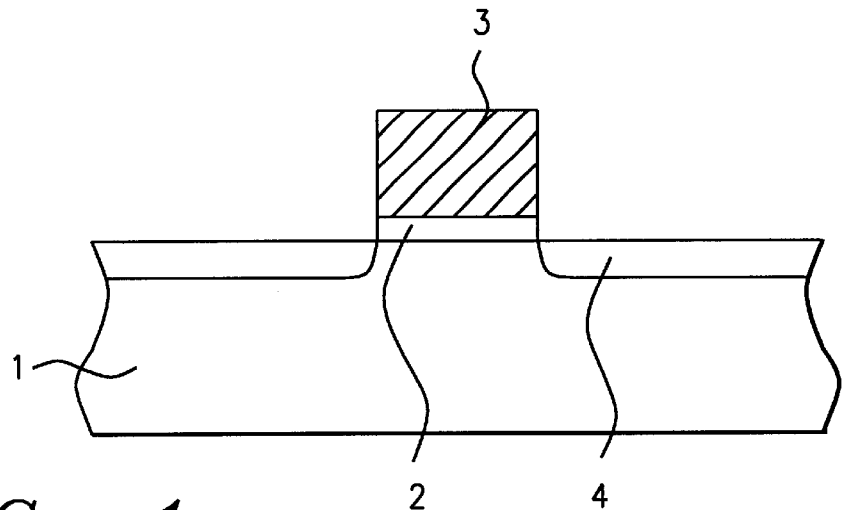
FIGS. 1–6, which schematically, in cross-sectional style, show the key stages of fabrication used to form a narrow width, polycide gate structure, featuring a low resistance titanium silicide layer, created using a pre-titanium, pre-amorphization, ion implantation procedure, and a post titanium, ion mixing, ion implantation procedure.

A P type, semiconductor substrate 1, comprised of single crystalline silicon, with a <100> crystallographic orientation, is used and shown schematically in FIG. 1. A gate insulator layer 2, comprised of silicon dioxide, is thermally grown in an oxygen—steam ambient at a temperature between about 800 to 1000° C., to a thickness between about 50 to 200 Angstroms. A polysilicon layer is next deposited, using low pressure chemical vapor deposition, (LPCVD), procedures, to a thickness between about 1000 to 4000 Angstroms. The polysilicon layer can be doped in situ, during deposition, via the addition of arsine, or phosphine, to a silane ambient, or the polysilicon layer can be deposited intrinsically, then doped via an ion implantation procedure, using arsenic, or phosphorous ions. Conventional photolithographic and reactive ion etching, (RIE), procedures, using $Cl_2$ as an etchant, are used to pattern the polysilicon layer, creating polysilicon structure 3, shown schematically in FIG. 1, with the width of polysilicon structure 3, less than 0.20 um. Removal of the photoresist shape, used for definition of polysilicon structure 3, is accomplished via plasma oxygen ashing and careful wet cleans. The portion of gate insulator 2, not covered by polysilicon structure 3, is removed during the wet clean procedures.

Lightly doped source/drain regions 4, are next formed in regions of semiconductor substrate 1, not covered by polysilicon structure 3, via an ion implantation procedure. If the desired MOSFET device is an N type, (NFET), device, lightly doped source drain region 4, are formed via ion implantation of arsenic, or phosphorous ions, at an energy between about 20 to 70 KeV, at a dose between about 1E13 to 5E14 atoms/$cm^2$. However if the MOSFET device is a P type, (PFET), lightly doped source drain region 4, is formed by an ion implantation procedure, using boron, or $BF_2$ ions, at an energy between about 20 to 70 KeV, at a dose between about 1E13 to 5E14 atoms/$cm^2$. The lightly doped source/drain regions, are schematically shown in FIG. 1.

Figure 2:
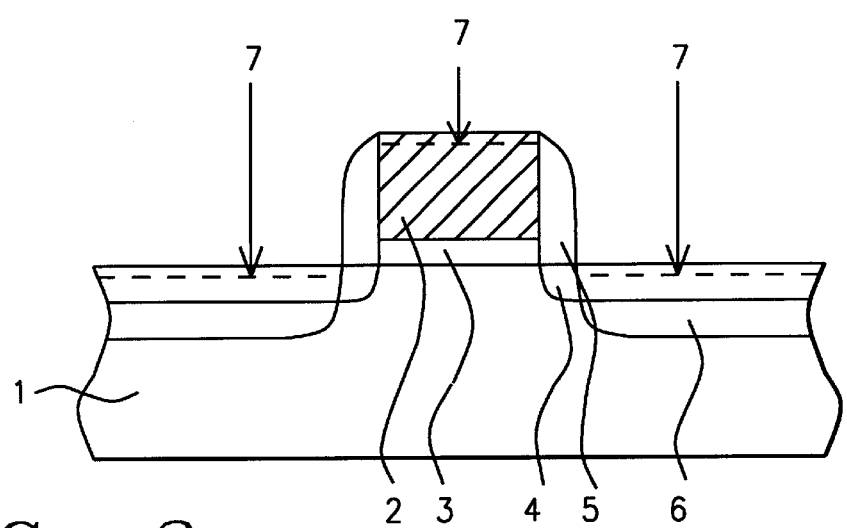

Insulator spacers 5, shown schematically in FIG. 2, are next formed on the sides of polysilicon structure 3. A layer of silicon oxide is deposited via LPCVD or plasma enhanced chemical vapor deposition, (PECVD), procedures, at a thickness between about 1000 to 3000 Angstroms. An anisotropic RIE procedure, using $CHF_3$ as an etchant, is then employed, resulting in the formation of insulator spacers 5. If desired insulator spacers 5, can be comprised of silicon nitride. Heavily doped source/drain region 6, is formed, via ion implantation procedures, in a region of semiconductor substrate 1, not covered by polysilicon structure 3, or by insulator spacers 5. Heavily doped source/drain region 6, if used for NFET devices, is obtained via ion implantation of arsenic, or phosphorous ions, at an energy between about 30 to 75 KeV, at a dose between about 5E14 to 1E16 atoms/$cm^2$, while a ion implantation procedure, using boron, or $BF_2$ ions, is performed at an energy between about 30 to 75 KeV, at a dose between about 5E14 to 1E16 atoms/$cm^2$, if PFET, MOSFET devices are used. The heavily doped source/drain region 6, is schematically shown in FIG. 2.

A critical ion implantation procedure, called a pre-amorphization procedure, is next performed. Subsequent formation of a low resistance, titanium silicide layer, will be in part, dependent on the amount of silicon moving from the polysilicon, or source/drain region, into the overlying, growing, titanium silicide layer. If to great a level of silicon is incorporated in the forming titanium silicide layer, the resistance of this metal silicide layer may be greater than desired. In addition, if the width of the gate structure is narrow, less than 0.20 um, the lack of a low resistance metal silicide layer, can result in a polycide gate structure, or word line, with non-acceptable resistance. Therefore a pre-amorphization, ion implantation procedure, near the top surface of polysilicon structure 3, or near the top surface of heavily source/drain region 6, will retard the movement of silicon, into the metal silicide layer, during a subsequent anneal procedure, that is used to form the metal silicide layer. The pre-amorphization procedure, is performed via ion implantation of germanium, or arsenic ions, at an energy between about 20 to 40 KeV, at a dose between about 2E14 to 5E14 atoms/$cm^2$. The implanted ions 7, are schematically shown in FIG. 2. In addition, this procedure also fixes, or sets, the dopants in the source/drain region, reducing the risk of increasing the source/drain region from diffusion during subsequent anneal cycle, thus preserving the shallow junctions needed for the high performance, MOSFET devices. Regions of the MOSFET device, designed to not incorporate metal silicide layers, are protected by a patterned insulator layer, such as silicon oxide, at a thickness between about 500 to 1500 Angstroms,(not shown in the drawings). The patterned insulator layer is formed from a rapid thermal oxidation, (RTO), and defined via conventional photolithographic and dry etching procedures, prior to the pre-amorphization ion implantation procedure, and is used to protect regions of the MOSFET device, from subsequent metal silicide formation.

Figure 3:
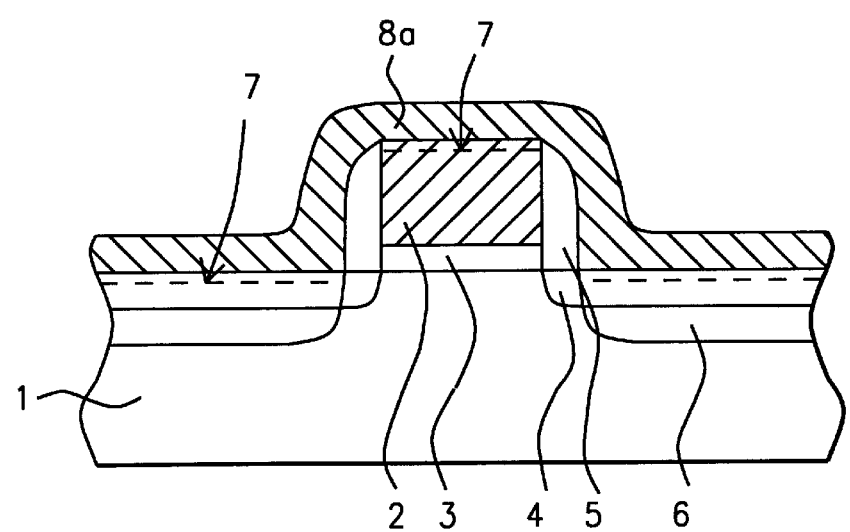
Figure 4:
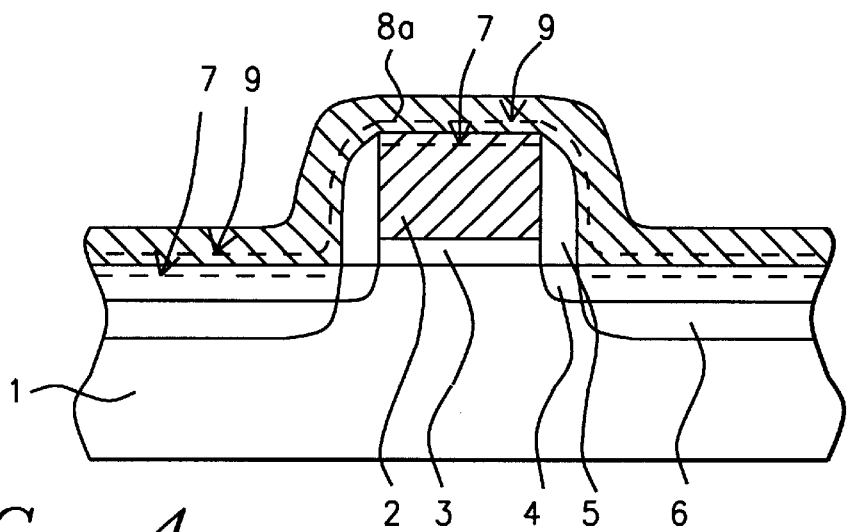

A titanium layer 8a, shown schematically in FIG. 3, is next deposited, via R.F. sputtering, to a thickness between about 500 to 1000 Angstroms. If desired a titanium nitride—titanium composite layer, can also be used. A second critical ion implantation procedure, called an ion mixing procedure, is next employed to place implanted ions 9, shown schematically in FIG. 4, in titanium layer 8a, at a depth near the bottom of the titanium layer, in an effort to further decrease the risk of silicon atoms, diffusing from underlying silicon regions, such as polysilicon structure 3, into the forming titanium silicide layer, during the subsequent anneal cycles. The ion mixing procedure is accomplished via ion implantation of germanium or silicon ions, at an energy between about 35 to 40 KeV, at a dose between about 7E14 to 1E15 atoms/$cm^2$. These condition place the implanted ions at a depth between about 500 to 1000 Angstroms, in titanium layer 8a.

Figure 5:
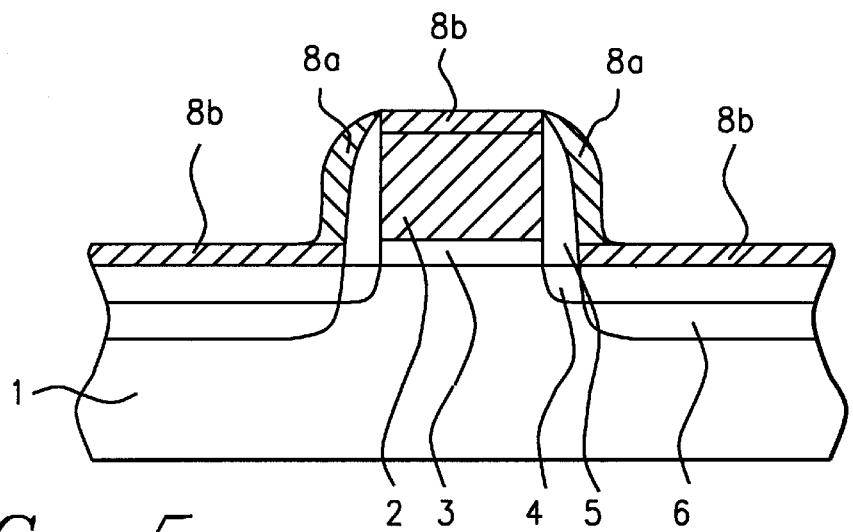

A first rapid thermal anneal, (RTA), procedure, is performed at a temperature between about 650 to 850° C., for a time between about 10 to 120 sec., in a nitrogen ambient, resulting in the formation of a first titanium silicide layer 8b, in regions in which titanium layer 8a, resided on either polysilicon structure 3, or heavily doped source/drain region 6. This is schematically shown in FIG. 5. The resistance of first titanium silicide layer 8b, was not compromised by excessive silicon diffusion into the forming layer, during the first RTA procedure, as a result of the combination of the pre-amorphization, and ion mixing, ion implantation procedures. Regions of titanium layer 8a, overlying insulator regions, such as insulator spacers 5, remained unreacted.

Figure 6:
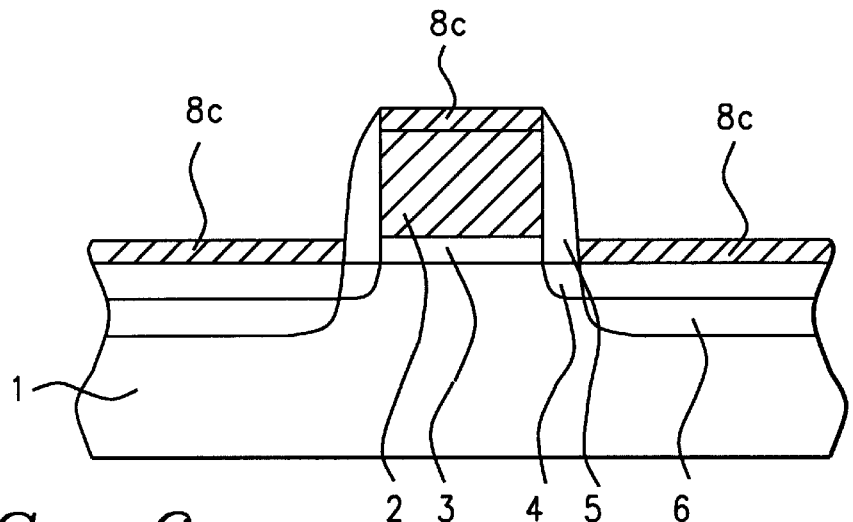

Unreacted regions of titanium layer 8a, are selectively removed using a solution containing $H_2O_2$—$H_2SO_4$—$NHOH_4$—HCl, at a temperature between about 50 to to 80° C. First titanium silicide layer 8b, is not soluble in the above solution, during the removal of unreacted titanium. A second RTA anneal, performed at a temperature between about 700 to 900° C., for a time between about 10 to 120 sec., in a nitrogen ambient, is used to convert first titanium silicide layer 8b, to a more conductive, second titanium silicide layer 8c, shown schematically in FIG. 6. The ability of the resulting metal silicide layer to withstand RTA procedures, without experiencing excessive silicon diffusion, or without compromising the sheet resistance of the metal silicide layer, is a result of the combination of the pre-amorphization, and ion mixing procedures, used to retard silicon diffusion. The polycide gate structure, shown schematically in FIG. 6, comprised of second titanium silicide layer 8c, on polysilicon structure 3, offers a low resistance structure for the narrow width, less than 0.20 um, polycide gate structure.

While this invention has been particularly shown and described with reference to the preferred embodiments thereof, it will be understood by those skilled in the art that various changes in form and details may be made without departing from the spirit and scope of this invention.

What is claimed is:

1. A method of fabricating a metal silicide layer, used as a component of a polycide, (metal silicide polysilicon), gate structure, on a semiconductor structure, comprising the steps of:

forming a polysilicon structure, on an underlying gate insulator layer, wherein said polysilicon structure is comprised from a polysilicon layer obtained via low pressure chemical vapor deposition procedures at a thickness between about 1000 to 4000 Angstroms, and either doped in situ during deposition via the addition of arsine, or phosphine, to a silane ambient, or deposited intrinsically then doped via an ion implantation procedure, using arsenic or phosphorous ions;

forming a lightly doped source/drain region, in an area of said semiconductor substrate, not covered by said polysilicon structure;

forming insulator spacers on the sides of said polysilicon structure;

forming a heavily doped source/drain region, in an area of said semiconductor substrate, not covered by said polysilicon structure, and not covered by said insulator spacers;

performing a pre-amorphization, ion implantation procedure, placing implanted ions into said polysilicon structure, and into said heavily doped source/drain region;

depositing a metal layer;

performing a ion mixing, ion implantation procedure, placing implanted ions into of said metal layer;

performing a first anneal procedure, to form a first metal silicide layer, on said polysilicon structure, and to form said first metal silicide layer on said heavily doped source/drain region, while leaving regions of said metal layer, on said insulator spacers, unreacted; and removing unreacted regions, of said metal layer;

performing a second anneal procedure, to convert said first metal silicide layer to a second metal silicide layer, resulting in said polycide gate structure, comprised of said second metal silicide layer, on said polysilicon structure.

2. The method of claim 1, wherein said polysilicon structure is formed via an anisotropic RIE procedure, applied to a polysilicon layer, with said polysilicon structure formed with a width of less than 0.20 um.

3. The method of claim 1, wherein said heavily doped source/drain region is an N type source/drain region, formed via ion implantation of arsenic or phosphorous ions, at an energy between about 30 to 75 KeV, at a dose between about 5E14 to 1E16 atoms/cm.

4. The method of claim 1, wherein said heavily doped source/drain region is a P type source/drain region, formed via ion implantation of boron, or of $BF_2$ ions, at an energy between about 30 to 75 KeV, at a dose between about 30 to 75 atoms/cm$^2$.

5. The method of claim 1, wherein said pre-amorphization, ion implantation procedure, is performed using germanium ions, implanted at an energy between about 20 to 40 KeV, at a dose between about 2E14 to 5E14 atoms/cm$^2$.

6. The method of claim 1, wherein said pre-amorphization, ion implantation procedure, is performed using arsenic ions, implanted at an energy between about 20 to 40 KeV, at a dose between about 2E14 to 5E14 atoms/cm$^2$.

7. The method of claim 1, wherein said metal layer, is a titanium layer, obtained via R.F. sputtering, at a thickness between about 500 to 1000 Angstroms.

8. The method of claim 1, wherein said ion mixing, ion implantation procedure, is performed using germanium ions, implanted at an energy between about 35 to 40 KeV, at a dose between about 7E14 to 1E15 atoms/cm$^2$, and to a depth in said metal layer, between about 500 to 1000 Angstroms.

9. The method of claim 1, wherein said ion mixing, ion implantation procedure, is performed using silicon ions, implanted at an energy between about 35 to 40 KeV, at a dose between about 7E14 to 1E15 atoms/cm$^2$, and to a depth in said metal layer, between about 500 to 1000 Angstroms.

10. The method of claim 1, wherein said first anneal procedure, used to form said first metal silicide layer, is a rapid thermal anneal procedure, performed at a temperature between about 650 to 850° C., for a time between about 10 to 120 sec., in a nitrogen ambient.

11. The method of claim 1, wherein said second anneal procedure, used to convert said first metal silicide layer, to said second metal silicide layer, is a rapid thermal anneal procedure, performed at a temperature between about 700 to 900° C., for a time between about 10 to 120 sec., in a nitrogen ambient.

12. A method of fabricating a low resistance, titanium silicide layer, for a narrow width, polycide gate structure, formed using a combination of a pre-titanium deposition, and a post-titanium deposition, ion implantation procedure, comprising the steps of:

forming a narrow width, polysilicon structure, on a silicon dioxide gate insulator layer, wherein said narrow width, polysilicon structure is formed from a polysilicon layer, obtained from low pressure chemical vapor deposition procedures at a thickness between about 1000 to 4000 Angstroms, and either doped in situ via the addition of arsine, or phosphine, to a silane ambient, or via ion implantation of arsenic or phosphorous ions into an intrinsically deposited polysilicon layer;

forming a lightly doped source/drain region, in an area of a semiconductor substrate not covered by said narrow width, polysilicon structure;

forming insulator spacers on the sides of said narrow width, polysilicon structure;

forming a heavily doped source/drain region, in an area of said semiconductor substrate not covered by said narrow width, polysilicon structure, and not covered by said insulator spacers;

performing said pre-titanium deposition, ion implantation procedure;

depositing a titanium layer;

performing said post-titanium deposition procedure;

performing a first RTA procedure, forming a first titanium silicide layer, on said narrow width, polysilicon structure, and forming a first titanium silicide layer, on said heavily doped source/drain region, while leaving the portion of said titanium layer, on said insulator spacers, unreacted;

selectively removing the unreacted portion, of said titanium layer; and performing a second RTA procedure, converting said first titanium silicide layer to a low resistance, second titanium silicide layer, resulting in said narrow width, polycide gate structure, comprised of said low resistance, second titanium silicide layer, on said narrow width, polysilicon structure.

13. The method of claim 12, wherein the width of said narrow width, polysilicon structure, is less than 0.20 um.

14. The method of claim 13, wherein said heavily doped source/drain region, is an N type, source/drain region, formed via ion implantation of arsenic, or phosphorous ions, at an energy between about 30 to 75 KeV, at a dose between about 5E14 to 1E16 atoms/cm$^2$.

15. The method of claim 12, wherein said heavily doped source/drain region, is a P type region, formed via ion implantation of boron, or BF$_2$ ions, at an energy between about 30 to 75 KeV, at a dose between about 5E14 to 1E16 atoms/cm$^2$.

16. The method of claim 12, wherein said pre-titanium deposition, ion implantation procedure is performed using germanium or arsenic ions, at an energy between about 20 to 40 KeV, at a dose between about 2E14 to 5E14 atoms/cm$^2$.

17. The method of claim 12, wherein said titanium layer is obtained via R.F. sputtering, to a thickness between about 500 to 1000 Angstroms.

18. The method of claim 12, wherein said post-titanium deposition, ion implantation procedure is performed using germanium or silicon ions, at an energy between about 35 to 40 KeV, at a dose between about 7E14 to 1E15 atoms/cm, with the germanium or silicon ions, located at a depth, in said titanium layer, between about 500 to 1000 Angstroms.

19. The method of claim 12, wherein said first RTA procedure is performed at a temperature between about 650 to 850° C., for a time between about 10 to 120 sec., in a nitrogen ambient.

20. The method of claim 12, wherein said second RTA procedure is performed at a temperature between about 700 to 900° C., for a time between about 10 to 120 sec., in a nitrogen ambient.

* * * * *